(12) United States Patent
Kato

(10) Patent No.: US 6,424,219 B1
(45) Date of Patent: Jul. 23, 2002

(54) OPERATIONAL AMPLIFIER

(75) Inventor: Fumihiko Kato, Yamagata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/007,466

(22) Filed: Nov. 5, 2001

(30) Foreign Application Priority Data

Dec. 6, 2000 (JP) .................................. 2000-371904

(51) Int. Cl.⁷ .............................................. H03F 3/45
(52) U.S. Cl. .......................... 330/255; 330/9; 330/53; 330/55; 330/64
(58) Field of Search ........................... 336/9, 253, 255, 336/264

(56) References Cited

U.S. PATENT DOCUMENTS 4,797,631 A * 1/1989 Hsu et al. .................. 330/253
6,066,985 A * 5/2000 Xu ............................. 330/253

* cited by examiner

*Primary Examiner*—Robert Pascal
*Assistant Examiner*—Henry Choe

(57) ABSTRACT

An operation amplifier 1 for driving an liquid crystal panel is constructed of: differential stage circuits 2, 3, drive stage circuits 4, 5, output transistors 11 to 14, switching means for switching the connections of the differential stage circuits 2, 3 and the drive stage circuits 4, 5, and a middle-potential side power source 10. These differential stage circuits 2, 3 and drive stage circuits 4, 5 are operated between the high-potential side power source 8 and the low-potential side power source 9. The output transistors 11, 12 are operated between the high-potential side power source 8 and the middle-power side power source 10, and also the output transistors 13, 14 are operated between the middle-potential side power source 10 and the low-potential side power source 9, which are alternately driven by the drive stage circuits 4, 5, respectively.

6 Claims, 8 Drawing Sheets

OPERATIONAL AMPLIFIER

BACKGROUND OF THE INVENTION

1. Field of the Invention

The present invention relates to an operational amplifier, especially to one to be used in a device for driving a liquid crystal panel.

2. Description of the Prior Art

Typically, a liquid crystal panel requires a writing operation at a speed of several tens of frames (several tens of sheets) per second. An output signal generated from a drive circuit of the liquid crystal panel is provided for performing an AC drive on the potential of a common electrode for each of scanning lines or frames. Referring now to FIGS. 7 and 8, we will describe an operational amplifier and a drive circuit of the conventional liquid panel, which perform such an AC drive on the potential of common electrode.

FIG. 7 is a circuit diagram that illustrates an example of the conventional operational amplifier for driving a liquid panel. As shown in the figure, the conventional operational amplifier 1a comprises differential input stage circuits 2, 3, output stage field effect transistors (FETS) 11–14, and drive stage circuits 4, 5, and it may be functionally used as a converting circuit for an output impedance. In the operational amplifier 1a, each of the differential input circuits 1, 3 is connected between a high-potential side power source (VDD) 8 and a low-potential side power source (VSS) 9. The differential input circuit 1(3) amplifies the differential potential between an analog input supplied to a positive input terminal 11(13) and an analog input supplied to a negative input terminal 12(14) and generates an output to a differential input stage output terminal 101 (102). One end of the FET 11(13) is connected to the high-potential side power source 8 and the other end thereof is connected to an output terminal VO1(VO2) of the operational amplifier 1a. In addition, one end of the FET 12(14) is connected to the low-potential side power source (VSS) 9 and the other end thereof is connected to an output terminal VO1(VO2) of the operational amplifier 1a. Each of the drive stage circuits 4, 5 is also connected between the high-potential side power source 8 and the lower-potential-power source 9. The drive stage circuit 4(5) supplies a drive output signal to the FETs 11 and 12 (13 and 14) through output terminals 105 and 106 (107 and 108) on the basis of the differential outputs from the output terminals 101, 102, respectively.

Each of the differential input stage circuits 2, 3 of the operational amplifier 1a is able to acquire the input range from a level at the low-potential side power source (VSS) to a level at the high-potential side power source (VDD). The output stage FET 11 has a gate electrode connected to an output terminal 105 of the drive stage circuit 4, a source electrode connected to a high-potential side power source 8, and a drain electrode connected to the output terminal VO1. Similarly, the output stage FET 13 has the connections to the drive stage circuit 5 and the output terminal VO2. Similarly, the output stage FETs 12, 14 have their connections to the low-potential side power source 9 and the output terminal VO2.

FIG. 8 is a circuit diagram that illustrates the configuration of an example of the circuit for driving the liquid crystal panel (hereinafter, simply referred to as a LCP-drive circuit) in which the conventional operational amplifier is used. As shown in the figure, the LCP-drive circuit 40a comprises: positive and negative side digital-to-analog (DA) converters 41, 42 that translate digital signals to analog signals with respect to input signals on the positive and negative sides, respectively; switching means 43, 44 for switching the translated outputs from the DA converters using the predetermined input control signals from the outside; the operational amplifier (see FIG. 7) for the operationally amplifying the outputs switched by the switching means 43, 44; and switching means 47, 48 for switching the outputs VO1, VO2 from the operational amplifier using control inputs from the outside and then supplying the outputs to output terminals OUT1, OUT2, respectively.

The DA converters 41, 42 perform digital to analog transformation to obtain analog data of middle-potential to high-potential side power source and analog data of middle-potential to low-potential side power source, respectively, depending of input digital data. Each of the switching means 43, 44, 47, 48 is constructed of a pair of switches S and Sb that perform different operations opposed to each other. Furthermore, the operational amplifier creates the negative feedback of signals, so that each of the outputs VO1, VO2 is feed backed to negative side inputs VI2, VI4 against positive side inputs VI1, VI3, respectively.

The LCP-drive circuit 40a can be actuated and operated as follows. At first, analog signals from the positive side DA converter 51 and analog signals from the negative side DA converter 42 are respectively introduced into the operational amplifier 1a when each switch S in the switching means 43, 44, 47, 48 is switched on (at this time, the switch Sb is switched off). Then, each input signal is subjected to an impedance conversion and is then generated as an output to the output terminal OUT1 or OUT2 through the switching means 47 or 48. In general, a plurality of output terminals is provided on the LCP-drive circuit 40a for driving each element of the liquid crystal panel. For simplifying the illustration and for the sake of expediency, the circuit 40a is described as one having two output terminals.

Likewise, when each switch Sb in the switching means 43, 44, 47, 48 is switched on (at this time, the switch S is switched off), analog signals selected with the positive side DA converter 41 is subjected to an impedance conversion and is then generated as an output to the output terminal OUT2, while those selected with the negative side DA converter 42 is subjected to an impedance conversion and is then generated as an output to the output terminal OUT1.

The LCP-drive circuit 40a is able to generate several tens of outputs of positive- or negative-side analog signals (i.e., to perform several tens of writing operations on the panel). If the scanning line is switched from one to another, then the terminal from which the negative side analog signals are outputted and the terminal from which the positive side analog signals are outputted are replaced with each other to operate with alternating current.

FIG. 9 is a timing chart of an output waveform of the conventional LCP-drive circuit. As shown in this figure, if the opposite switching operations of switches S, Sb are performed, signal waveforms for the discharge of the liquid crystal panel to be outputted to the output terminals OUT1, OUT2 may be changed from the voltage at the high-potential side power source VDD to the voltage at the low-potential side power source VSS and from the voltage at the low-potential side power source VSS to the voltage at the high-potential side power source VDD, respectively.

The liquid crystal panel described above is provided as a capacitive load. As for driving such a liquid crystal panel due to the change in analog signals to be inputted, therefore, it means that the capacitive load of the panel can be charged and discharged.

As described above, furthermore, the LCP-drive circuit repeats the operation in which the positive- or negative-side voltage is outputted several ten times, the output polarity is then replaced, and the negative- or positive-side voltage is subsequently outputted several ten times.

The charge and discharge of the capacitive load is performed between the high-potential side power source and the low-potential side power source, so that a power consumption P per one output can be expressed by the following equation.

$$P=C \times f \times Vpp \times VDD$$

Wherein VDD denotes the potential difference between the high-potential side power source and the low-potential side power source, Vpp denotes a writing amplitude, f(Hz) denotes a writing frequency, and C denotes the capacity value of the capacitive load of liquid crystal panel.

Therefore, the conventional operation amplifier and the conventional LCP-drive circuit using such an amplifier described above has a problem that the power consumption P can be increased as the potential difference between the high-potential side power source and the low-potential side power source can be VDD (when VSS equals to zero volt) even though the writing of the positive- or negative-output voltage is only performed several ten times.

Furthermore, when the liquid crystal panel is operated with alternating current, the liquid panel should be designed to reduce an unevenness of its display to a minimum.

BRIEF SUMMARY OF THE INVENTION

Object of the Invention

An object of the present invention is to provide an operational amplifier that is able to reduce an unevenness of display on the liquid crystal panel to be generated at the time of operating the liquid crystal panel with alternating current in addition to decrease the amount of charge or discharge power of the panel load to be consumed at the time of operating the liquid crystal panel with alternating current.

Summary of the Invention

In accordance of the present invention, there is provided an operational amplifier that comprises: a first differential input stage circuit having a differential input terminal including a first positive input terminal and a first negative input terminal and a first output end, which is connected between a low-potential side power source and a high-potential power side to ensure an input range from a level at the low-potential side power source to a level at the high-potential side power source; a second differential input stage circuit having a differential input terminal including a second positive input terminal and a second negative input terminal and a first output end, which is connected between a low-potential side power source and a high-potential power side to ensure an input range from a level at the low-potential side power source to a level at the high-potential side power source; a first drive stage circuit having a first input end, a third output end, and a fourth output end, which is connected between the low potential side power source and the high potential side power source; a second drive stage circuit having a second input end, a fifth output end, and a sixth output end, which is connected between the low potential side power source and the high potential side power source; a first semiconductor device in which a first electrode is connected to a third output end of the first drive stage circuit and a second electrode is connected to the high-potential side power source, and a third electrode is connected to the first output terminal; a second semiconductor device in which a first electrode is connected to a fourth output end of the first drive stage circuit and a second electrode is connected to a middle-potential side power source, and a third electrode is connected to the first output terminal; a third semiconductor device in which a first electrode is connected to a fifth output end of the second drive stage circuit and a second electrode is connected to the middle-potential side power source, and a third electrode is connected to the second output terminal; a fourth semiconductor device in which a first electrode is connected to a sixth output end of the second drive stage circuit and a second electrode is connected to the low-potential potential side power source, and a third electrode is connected to the second output terminal; a first switching means having switches respectively connecting to the first output end of the first differential input stage circuit and the first input end of the first drive stage circuit and the second input end of the second drive stage circuit, in which the switches are operated in reverse with each other; and a second switching means having switches respectively connecting to the second output end of the second differential input stage circuit and the first input end of the first drive stage circuit and the second input end of the second drive stage circuit, in which the switches are operated in reverse with each other.

BRIEF DESCRIPTION OF THE DRAWINGS

The above and other objects, effects, features and advantages of the present invention will become more apparent by reference to the following detailed description of the invention taken in conjunction with the accompanying drawings, wherein.

DETAILED DESCRIPTION OF THE INVENTION

Hereinafter, we will describe exemplified operational amplifiers as preferred embodiments of the present invention with reference to the attached drawings.

Figure 1:
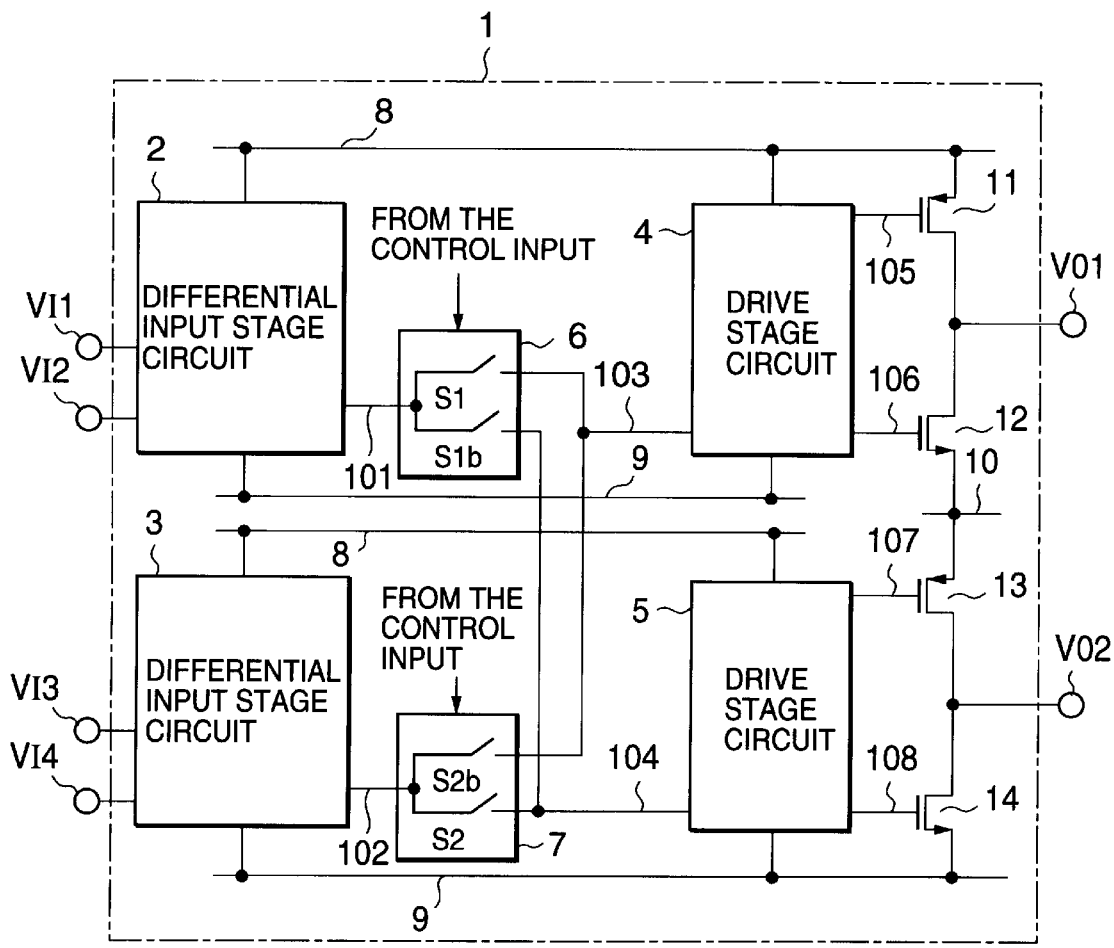
FIG. 1 is a circuit diagram that illustrates the configuration of an operational amplifier for a liquid crystal panel as a preferred embodiment of the present invention.

FIG. 1 shows the configuration of an operational amplifier for a liquid crystal panel as a first preferred embodiment of the present invention. As shown in the figure, the operational amplifier 1 comprises: differential input stage circuits 2, 3; output stage FETs 11, 12; output stage FETs 13, 14; switching means 6, 7; and drive stage circuits 4, 5. That is, the differential input stage circuit 2(3) is connected between a high-potential side power supply (VDD) 8 and a low-potential side power supply (VSS) 9. Also, the differential input stage circuit 2(3) is designed to amplify the differential voltage between analog inputs to be supplied to a positive input terminal VI1 (VI3) and a negative input terminal VI2 (VI4) and to output the amplified differential potential to a differential input stage output terminal 101 (102). The output stage FET 11(12) is connected between the high-potential side power supply (VDD) 8 and a middle-potential side power supply (VDD/2) 10 in series, where each connecting point of their connections is also connected to an output terminal VO1. The output stage FETs 13(14) is connected between the middle-potential side power supply (VDD/2) 10 and the low-potential side power supply (VSS) 9 in series, where each connecting point of their connections is also connected to an output terminal VO2. The switching means 6(7) comprises a set of switches S1, Sb (S2b, S2). The switches S1, Sb (S2b, S2) are connected between a differential input stage output terminals 101(102) and a drive stage input terminal 103(104) and each of the switches S1, S2 (S2b, S2) is operated as opposite to the other. Furthermore, the drive stage circuit 4(5) is connected between the high-potential side power source 8 and the low-potential side power source 9 and supplies drive outputs to the output stage FETs 11, 12 (13, 14) on the basis of signals from an input terminal 103(104) through output terminals 105, 106 (107, 108). The operational amplifier may be functionally used as a conversion circuit of output impedance. Each of these differential input stage circuits 2, 3 is able to obtain an input range from the low-potential side power source level (VSS) to the high-potential side power source level (VDD).

The features of the present operational amplifier 1 for driving the liquid crystal panel are the addition of switching means 6, 7 and the middle-potential side power supply 10. In the switching means 6, 7, their structural switches S1, S2 are turned on and off in phase with each other. In addition, the switches S1b, S2b are turned on and off in phase with each other but in opposite phase with the switches S1, S2. Furthermore, the middle-potential side power supply 10 allows the speeding up of rising output voltage at each of the output terminals VO1, VO2 to reduce the electric power of charging or discharging the panel load in addition to prevent the generation of an image unevenly displaced on the liquid crystal panel at the time of operating with alternating current.

Figure 2:
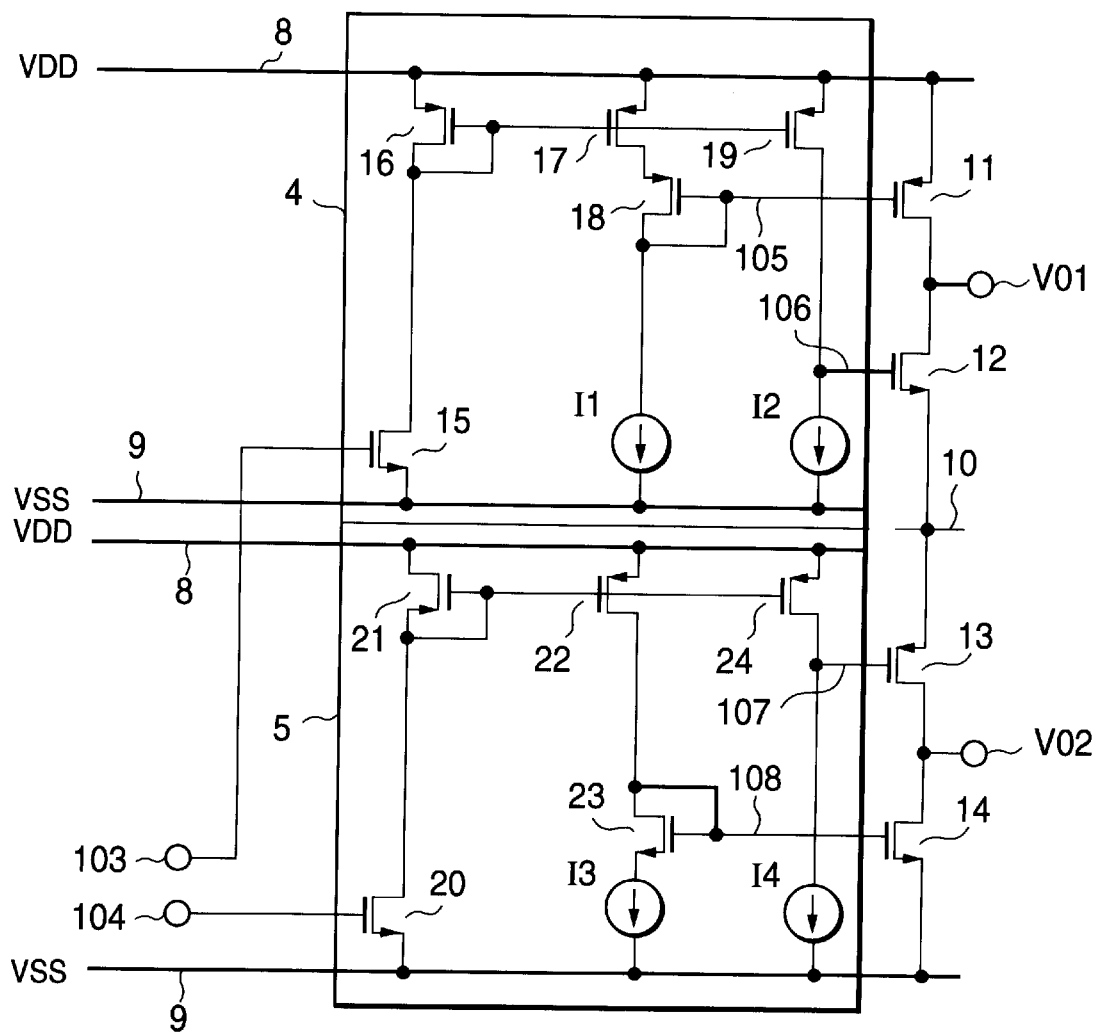
FIG. 2 is circuit diagram that illustrates the details of a first exemplified drive stage circuit of the operational amplifier shown in FIG. 1.

FIG. 2 is a circuit diagram that illustrates a first example of the drive stage circuit of the operational amplifier shown in FIG. 1. As shown in FIG. 2, the drive stage circuit 4 of the operational amplifier comprises: a FET 15 in which a gate electrode is connected to an input terminal 103 and a source electrode is connected to a low-potential side power source 9 (VSS); a FET 16 in which a gate electrode and a drain electrode are connected to a drain electrode of the FET 15 and a source electrode is connected to a high-potential side power source 8 (VDD); a FET 17 in which a gate electrode is connected to the drain electrode of the FET 15 and the gate and drain electrodes of the-FET 16 and a source electrode is connected to the high-potential side power source 8; a FEAT 18 in which a gate electrode and a drain electrode are connected to an output terminal 105 and a source electrode is connected to a drain electrode of the FEAT 17; a FET 19 in which a gate electrode is connected to the drain electrode of the FET 15, the gate and drain electrodes of the FET 16, and the gate electrode of the FET 17, a source electrode is connected to the high-potential side power source 8, and a drain electrode is connected to an output terminal 106; a constant current source I1 in which one end thereof is connected to the gate and drain electrodes of the FET18 and the output terminal 105 and the other end thereof is connected to the low-potential side power source 9; and a constant current source I2 in which one end thereof is connected to the drain electrode of the FET 19 and the output terminal 106 and the other end thereof is connected to the low-potential side power source 9.

Similarly, the drive stage circuit 5 comprises: a FET 20 in which a gate electrode is connected to an input terminal 104 and a source electrode is connected to a low-potential side power source 9; a FET 21 in which a gate electrode and a drain electrode are connected to a drain electrode of the FET 20 and a source electrode is connected to a high-potential side power source 8; a FET in which a gate electrode and a drain electrode are connected to a drain electrode of the FET 20 and a source electrode is connected to the high-potential side power source 8; a FET 23 in which a gate electrode and a drain electrode are connected to an output terminal 108 and the drain electrode of the FET 22; a FET 24 in which a gate electrode is connected to the drain electrode of the FET 20 and the gate and drain electrodes of the FET 21, and a source electrode is connected to the high-potential side power source 8; and a drain electrode is connected to an output terminal 107; a constant current source I3 in which one end thereof is connected to the source electrode of the FET 23 and the other end thereof is connected to the low-potential side power source 9; and a constant current source I4 in which one end thereof is connected to the drain electrode of the FET 24 and the output terminal 107 and the other end thereof is connected to the low-potential side power source 9.

These drive stage circuits 4, 5 perform their respective operations. In other words, when the input signals 103, 104 transformed from output signals from the differential input stage circuits 2,3 by the switching means 6, 7 are supplied, these signals are transformed into output signals 105, 106 and 107, 108 by the drive stage circuits 4, 5 to finally transport the output signals 105, 106 and 107, 108 to the output FETs 11, 12 and the output FETs 13, 14, respectively.

For instance, in a positive input terminal VI1(VI3) and a negative input terminal VI2(VI4) of the differential input stage circuit 2(3), if the potential level of the positive input terminal VI1(VI3) becomes high compared with that of the negative input terminal VI2(VI4), an output signal 101(102) of the differential input stage circuit 2(3) becomes a starting-up signal. Such a signal is transformed by the drive stage circuit 4(5) and finally generated as a break signal to be sent to the output FETs 11, 12 (13, 14). Subsequently, in the final stage output FETs 11, 12 (13, 14), the FET 11(13) becomes low resistance and the FET 12(14) becomes high resistance, so that they can be generated as charge signals against the load.

Similarly, in a positive input terminal VI1(VI3) and a negative input terminal VI2(VI4) of the differential input stage circuit 2(3), if the potential level of the positive input terminal VI1(VI3) becomes low compared with that of the negative input terminal VI2 (VI4), an output signal 101(102) of the differential input stage circuit 2(3) becomes a starting-up signal. Such a signal is transformed by the drive stage circuit 4(5) and finally generated as a starting-up signal to be sent to the output FETs 11, 12 (13, 14). Subsequently, in the final stage output FETs 11, 12 (13, 14), the FET 11(13)

becomes high resistance and the FET 12(14) becomes low resistance, so that they can be generated as discharge signals against the load.

Consequently, these drive stage circuits 4, 5 allow push-pull operations against the load, respectively.

Furthermore, using the drive stage circuits 4 and 5, there is no operational trouble even though the source electrode potentials of the respective final stage output FETs 12 and 13 are floated with respect to the back-gate potentials because of the following reason. That is, the amount of constant current passing through each of the final stage output FETs 11, 12 (13, 14) can be determined by the FET 18(23) in the drive stage circuit 4 5) and the output stage FET 11 (14) that makes up a current mirror. In this case, there is no trouble caused even though the potential of the source electrode of the output stage FET 12(13) is floated with respect to the back gate electrode potential.

Figure 3:
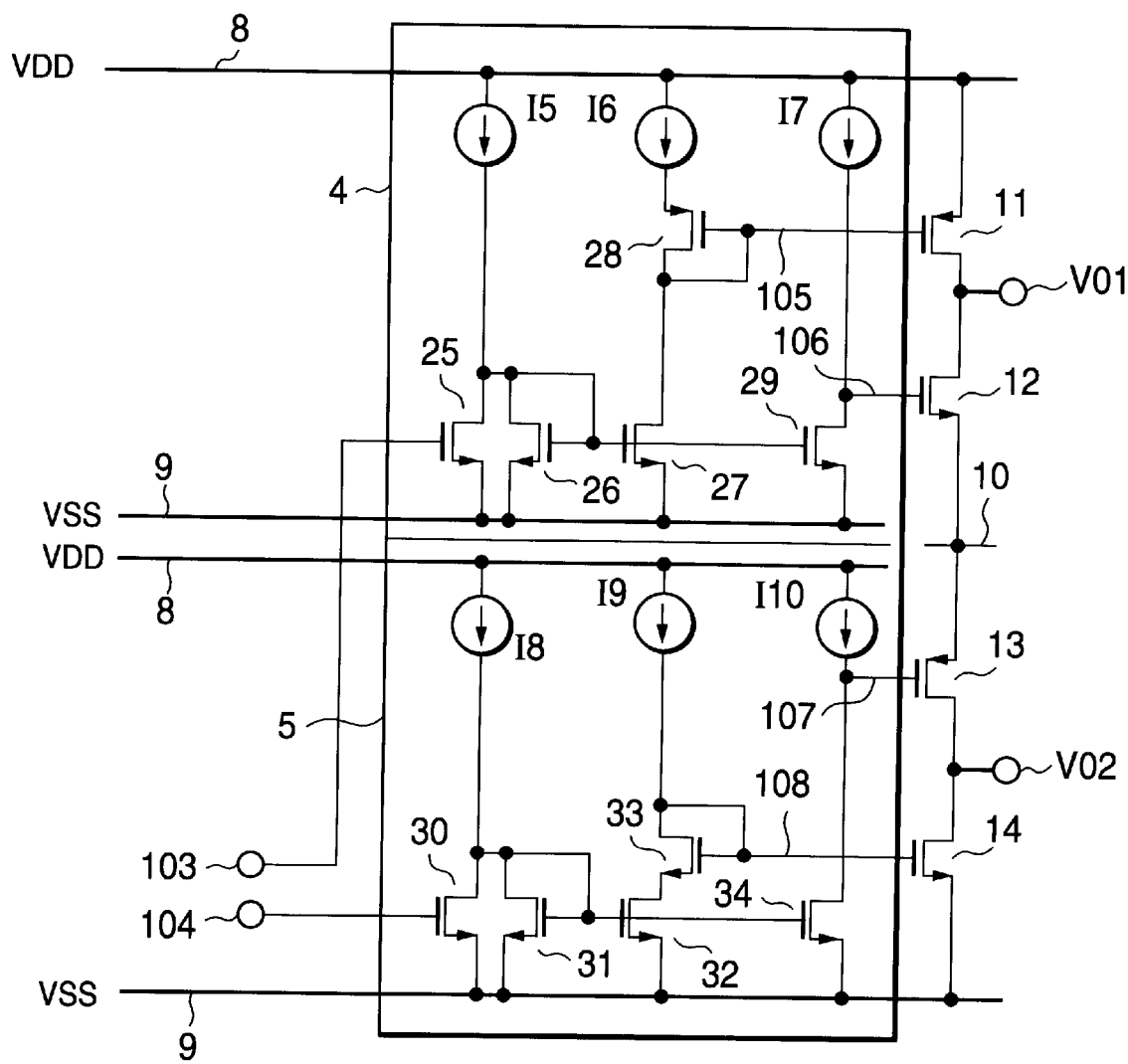
FIG. 3 is a circuit diagram that illustrates the details of a second exemplified drive stage circuit of the operational amplifier shown in FIG. 1.

FIG. 3 is a circuit diagram for illustrating a second example of the drive stage circuit on the operational amplifier of FIG. 1 in detail. As shown in FIG. 3, a drive stage circuit 4 in an operational amplifier comprises: a FET 25 in which a gate electrode is connected to an input terminal 103 and a source electrode is connected to a low-potential side power source(VSS) 9; a FET 26 in which a gate electrode and a drain electrode are connected to a drain electrode of the FET 25 and a source electrode is connected to the low-potential side electrode 9; a FET 27 in which a gate electrode is connected to the drain electrode of the FET 25 and the gate and drain electrodes of the FET 26 and a source electrode is connected to the low-potential side power source 9; a FET 28 in which a gate electrode and a drain electrode are connected to the drain electrode of the FET 27 and an output terminal 105; a FET 29 in which a gate electrode is connected to the drain electrode of the FET 25, the gate and drain electrodes of the FET 26, and the gate electrode of the FET 27, a source electrode is connected to the low-potential side power source 9, and a drain electrode is connected to an output terminal 106; a constant current source I5 in which one and thereof is connected to the drain electrode of the FET 25, the gate and drain electrodes of the FET 26, the gate electrode of the FET 27, and the gate electrode of the FET 29 and the other end thereof is connected to a high-potential side electrode 8; a constant current source I6 in which one end thereof is connected to the source electrode of the FET 28 and the other end thereof is connected to the high-potential side power source 8; and a constant current source I7 in which one end thereof is connected the drain electrode of the FET 29 and the output terminal 106.

Similarly, the drive stage circuit 5 comprises: a FET in which a gate electrode is connected to an input terminal 104 and a source electrode is connected to a low-potential side power source 9; a FET 31 in which a gate electrode and a drain electrode are connected to a drain electrode of the FET 30 and a source electrode is connected to the low-potential side electrode 9; a FET 32 in which a gate electrode is connected to the drain electrode of the FET 30 and the gate and drain electrodes of the FET 31 and a source electrode is connected to the low-potential side power source 9; a FET 33 in which a gate electrode and a drain electrode are connected to an output terminal 108 and a source electrode is connected to the drain electrode of the FET 32; a FET 34 in which a gate electrode is connected to the drain electrode of the FET 30, the gate and drain electrodes of the FET 31, and the gate electrode of the FET 32 and a drain electrode is connected to an output terminal 107; a constant current source I8 in which one end thereof is connected to the drain electrode of the FET 30, the gate and drain electrodes of the FET 31, the gate electrode of the FET 32, and the gate electrode of the FET 34 and the other end thereof is connected to a high-potential side power source 8; a constant current source I9 in which one end thereof is connected to the gate and drain electrodes of the FET 33 and the output terminal 108 and the other end thereof is connected to the high-potential side power source 8; and a constant current source I10 in which one end thereof is connected to the drain electrode of the FET 34 and the output terminal 107.

In this case, the drive stage circuits 4, 5 performs the operations just as in the case with the first example shown in FIG. 2, so that the description thereof will be omitted.

Figure 4:
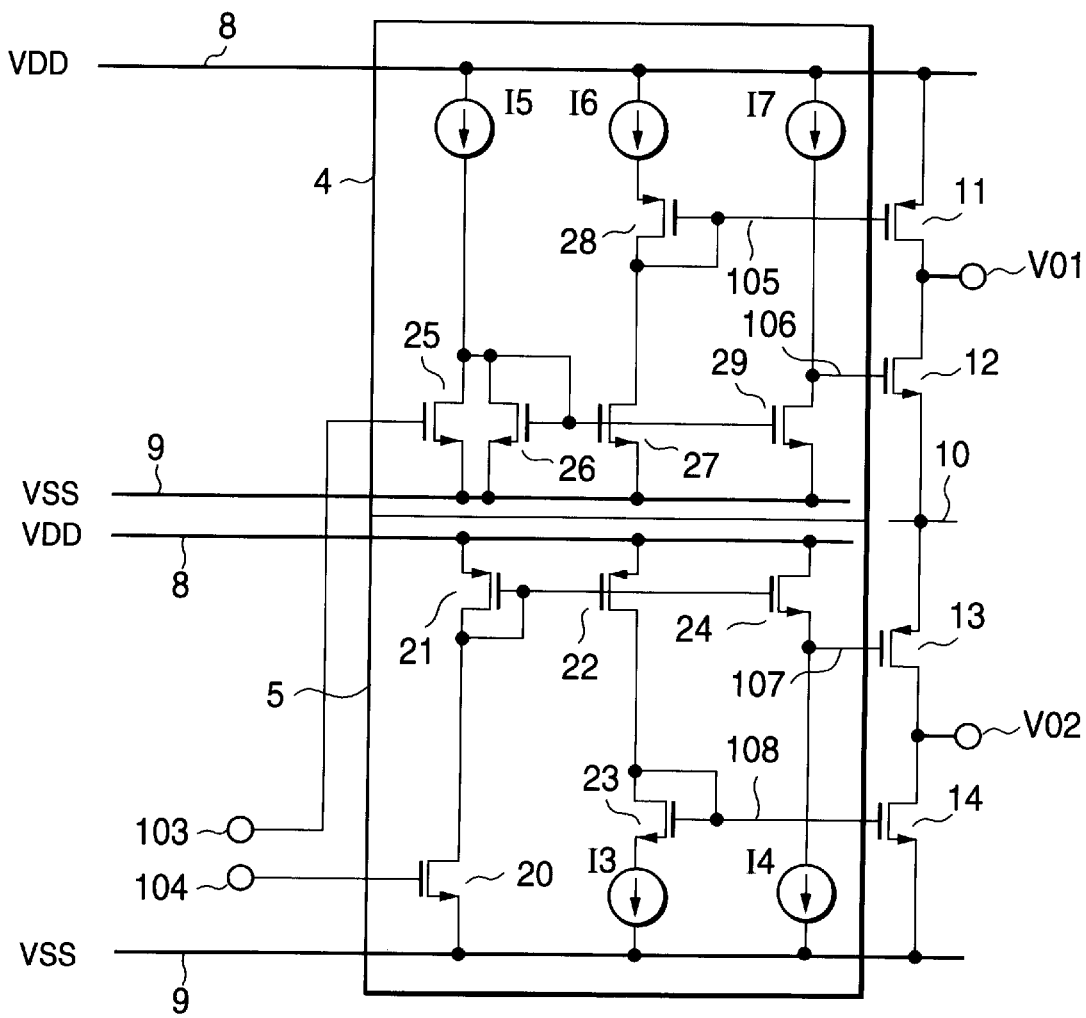
FIG. 4 is a circuit diagram that illustrates the details of a third exemplified drive stage circuit of the operational amplifier shown in FIG. 1.

FIG. 4 is a circuit diagram for illustrating a third example of the drive stage circuit in the operational amplifier shown in FIG. 1. In this case, as shown in FIG. 4, the drive stage circuit of the operational amplifier is constructed of a combination of the drive stage circuit 4 of the second example shown in FIG. 3 and the drive stage circuit 5 of the first example shown in FIG. 2.

That is, the drive state circuit 4 comprises: a FET 25 in which a gate electrode is connected to an input terminal 103 and a source electrode is connected to a low-potential side power source 9; a FET 26 in which a gate electrode and a drain electrode are connected to the drain electrode of the FET 25 and a source electrode is connected to the low-potential side power source 9; a FET 27 in which a gate electrode is connected to the gate electrode of the FET 26 and a source electrode is connected to the low-potential side power source 9; a FET 28 in which a gate electrode and a drain electrode are connected to the drain electrode of the FET 27 and an output terminal 105; a FET 29 in which a gate electrode is connected to the gate electrode of the FET 27, a source electrode is connected to the low-potential side power source 9, and a drain electrode is connected to an output terminal 106; a constant current source I5 which is connected between the drain electrode of the FET 25 and a high-potential side power source 8; a constant current source I6 which is connected between the source electrode of the FET 28 and the high-potential side power source 8; and a constant current source I7 which is connected between the output terminal 106 and the high-potential side power source 8.

On the other hand, the drive stage circuit 5 comprises: a FET 20 in which a gate electrode is connected to an input terminal 104 and a source electrode is connected to a low-potential side power source 9; a FET 21 in which a gate electrode and a drain electrode are connected to a drain electrode of the FET 20 and a source electrode is connected to a high-potential side power source 8; a FET 22 in which a gate electrode is connected to a gate electrode of the FET 21 and a source electrode is connected to the high-potential side power source 8; a FET 23 in which a gate electrode and a drain gate electrode are connected to the drain electrode of the FET 22 and an output terminal 108; a FET 24 in which a gate electrode is connected to the gate electrode of the FET 22, a source electrode is connected to the high-potential side power source, and a drain electrode is connected to an output terminal 107; a constant current source I3 which is connected between the source electrode of the FET 23 and the low-potential side power source 9; and a constant current source I4 which is connected between the drain electrode of the FET 24 and the low-potential side power source 9.

In this case, the drive stage circuits 4, 5 performs the operations just as in the case with the first example shown in FIG. 2, so that the description thereof will be omitted.

Alternatively, the drive stage circuits shown in FIG. 2 and FIG. 3 may be combined in reverse with respect to one shown in FIG. 4. For instance, the drive stage circuit 4 shown in FIG. 2 may be used as a first drive stage circuit and the drive stage circuit 5 shown in FIG. 3 may be used as a second drive set circuit.

Figure 5:
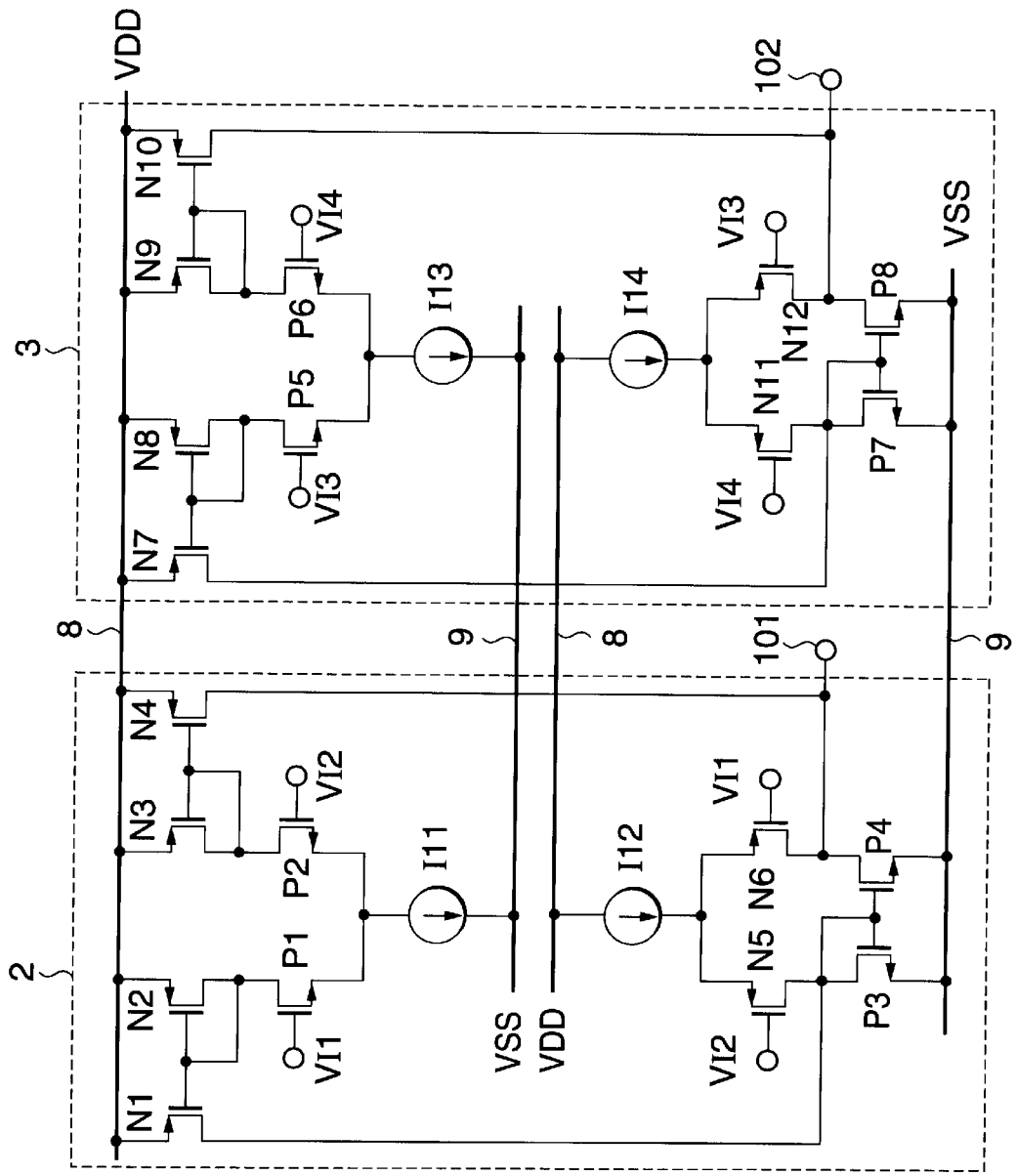
FIG. 5 is a circuit diagram that illustrates an exemplified differential input stage circuit of the operational amplifier shown in FIG. 1.

FIG. 5 is a circuit diagram for illustrating an embodiment of the differential input stage circuit in the operational amplifier shown in FIG. 1 in detail. As shown in the figure, differential input stage circuits 2, 3 of the above operational amplifier 1 can be fabricated as follows.

For instance, the differential input stage circuit 2 comprises: FETs P1 and P2 (PMOS transistors) in which their respective source electrodes are connected in common with each other and their gate electrodes are respectively connected to a first positive input terminal VI1 and a first negative input terminal VI2; FET N2 (NMOS transistor) in which a gate electrode and a drain electrode are connected to a drain electrode of the FET P1 and a source electrode is connected to a high-potential side power source (VDD) 8; a FET N3 (NMOS transistor) in which a gate electrode and a drain electrode are connected to the drain electrode of the FET N2 and a source electrode is connected to a high-potential side potential source 8; a FET N1 (NMOS transistor)in which a gate electrode is connected to the gate and drain electrodes of the FET N2 and the drain electrode of the FETP 1, a source electrode is connected to the high-potential side power source; a FET N4 (NMOS transistor) in which a gate electrode is connected to the gate and drain electrodes of the FET N3 and the drain electrode of the FET P2, a source electrode is connected to the high-potential side power source 8, and a drain electrode is connected to a first output terminal; a FET N5 (NMOS transistor) in which a gate electrode is connected to a first negative input terminal VI6; a FET N6 (NMOS transistor) in which a gate electrode is connected to a first positive input terminal VI1; a FET P3 (PMOS transistor) in which gate and drain electrodes are connected to the drain electrodes of the FET N1 and FET N5 and a source electrode is connected to the low-potential side power source 9; a FET P4 (PMOS transistor) in which a gate electrode is connected to the FET N1, the drain electrode of the FET N5, and the gate and drain electrodes of FET P3, a source electrode is connected to the low-potential side power source, and a drain electrode is connected to a first output terminal 101 and the drain electrode of the FET N6; a first constant current source I11 in which one end thereof is connected to source electrodes of the FETs P1, P2 and the other end thereof is connected to the low-potential side power source 9; and a second constant current source I12 in which one end thereof is connected to the source electrodes of the FETs N5, N6 and the other end thereof is connected to the high-potential side electrode 8.

Similarly, the differential input stage circuit 3 comprises: a FETs P5 and P6 (PMOS transistors) in which their source electrodes are connected in common with each other and their gate electrodes are respectively connected to a second positive input terminal VI3 and a second negative input terminal VI4; a FET N8 (NMOS transistor) in which a gate electrode and a drain electrode are connected to the drain electrode of the FET P5 and a source electrode is connected to a high-potential side electrode 8; a FET N9 (NMOS transistor) in which a gate electrode and a drain electrode are connected to the drain electrode of the FET P6 and a source electrode is connected to the high-potential side power source 8; a FET N7 (NMOS transistor) in which a gate electrode is connected to the gate and drain electrodes of the FET N8 and the drain electrode of the FET P5 and a source electrode is connected to the high-potential electrode 8; a FET N10 (NMOS transistor) in which a gate electrode is connected to the gate and drain electrodes of the FET N9 and the drain electrode of the FET P6, a source electrode is connected to the high-potential side power source 8, and a drain electrode is connected to a second output terminal 102; FETs N11 and N12 (NMOS transistors) in which their source electrodes are connected in common with each other and their gate electrodes are 515 respectively connected to a second negative input terminal VI4 and a second positive input terminal VI3; a FET P7 (PMOS transistor)in which gate and drain electrodes are connected to the drain electrodes of the FETs N7 and N11 and a source electrode is connected to a low-potential side power source 9; a FET P8 (PMOS transistor)in which a gate electrode is connected to the drain electrodes of the FETs N7 and N11 and the gate and drain electrodes of the FET P7, a source electrode is connected to the low-potential side power source 9, and a drain electrode is connected to a second output terminal 102 and the drain electrode of the FET N12; a third constant current source I13 in which one end thereof is connected to the source electrodes of the FETs P5 and P6 and the other end thereof is connected to the low-potential side power source 9; and a fourth constant current source I14 in which one end thereof is connected to the source electrodes of the FETs N11 and N12 and the other end thereof is connected to the high-potential side power source 8.

In the above embodiments, but not limited to, semiconductors used for preparing the differential input stage circuits 2, 3 are metal oxide semiconductor field-effect transistors (MOSFETs). Alternatively, each of them may be a bipolar transistor having a base electrode, an emitter electrode, and a collector electrode. In addition, the high-potential side power source and the low-potential side power source may be constructed to change their places. Furthermore, an operational amplifier for a liquid crystal panel may be formed by combining the above differential input stage circuits 2, 3 and the above drive stage circuits 4, 5 shown in FIG. 2 to FIG. 5.

Figure 6:
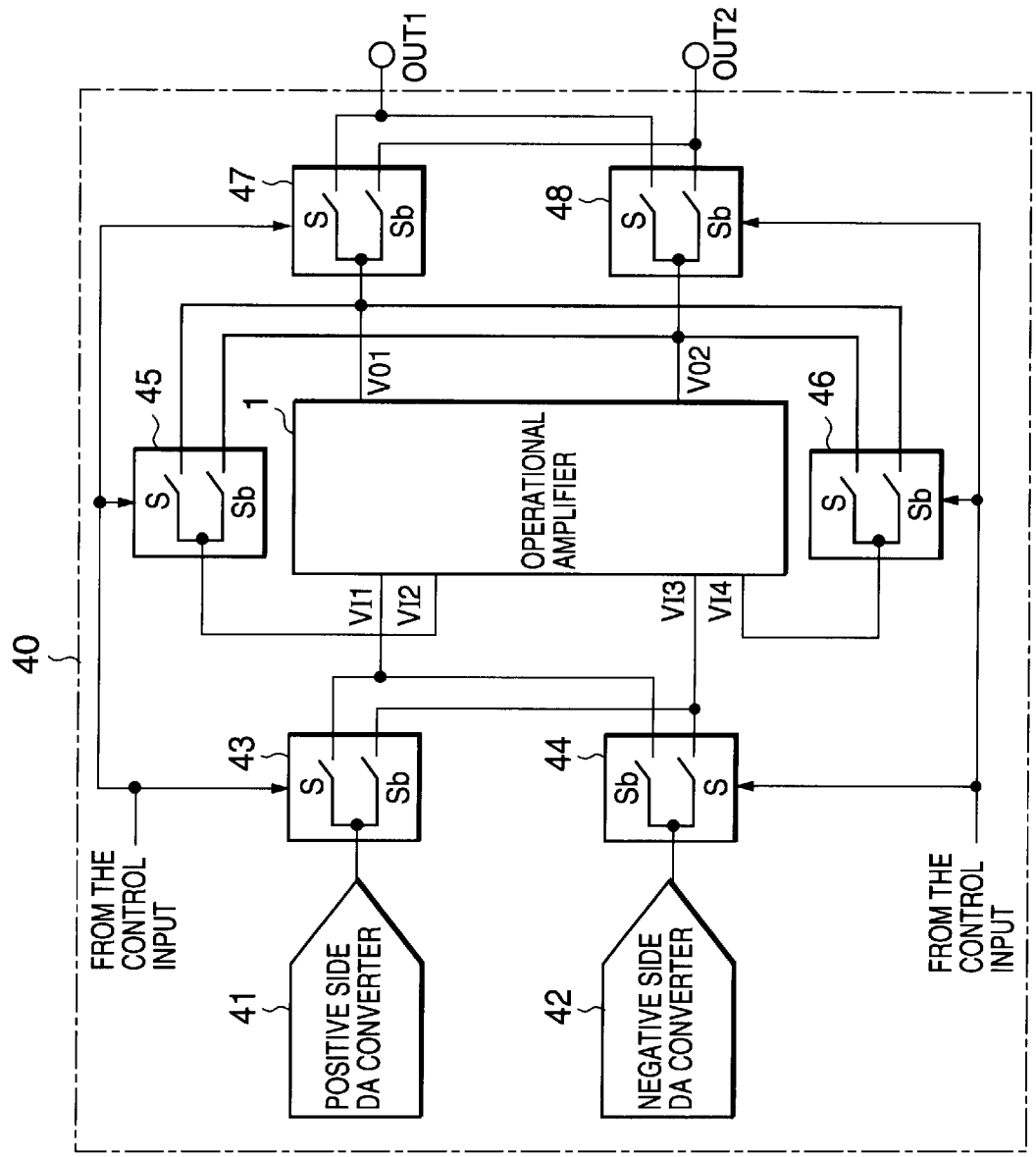
FIG. 6 is a circuit diagram that illustrates the configuration of an operational amplifier as another preferred embodiment of the present invention.
Figure 7:
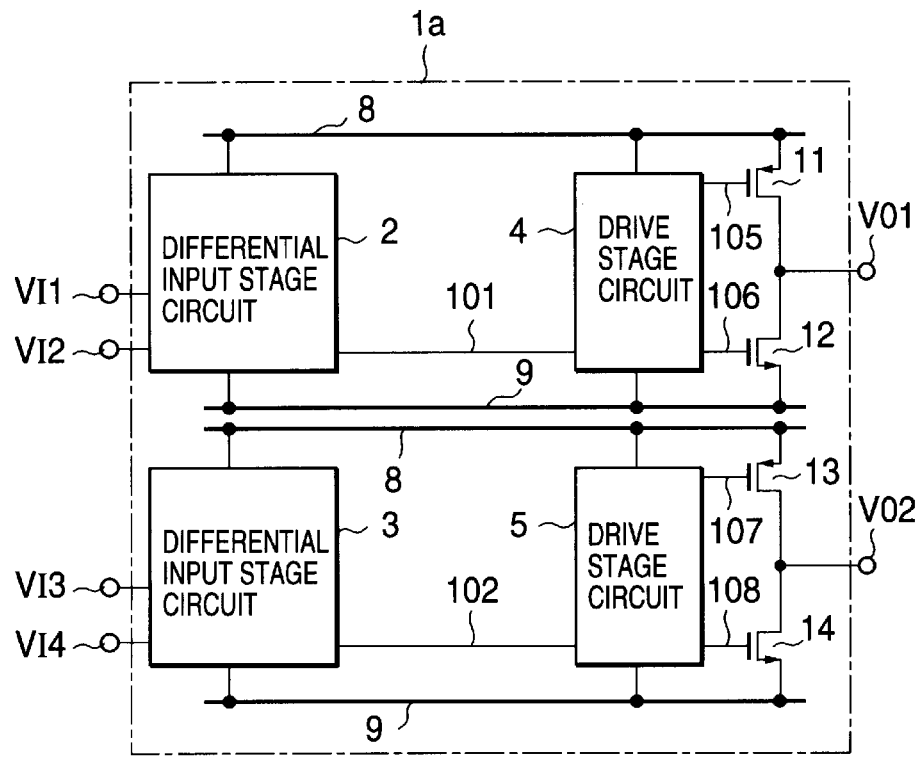
FIG. 7 is a circuit diagram that illustrates an example of the conventional operational amplifier for driving a liquid crystal panel.
Figure 8:
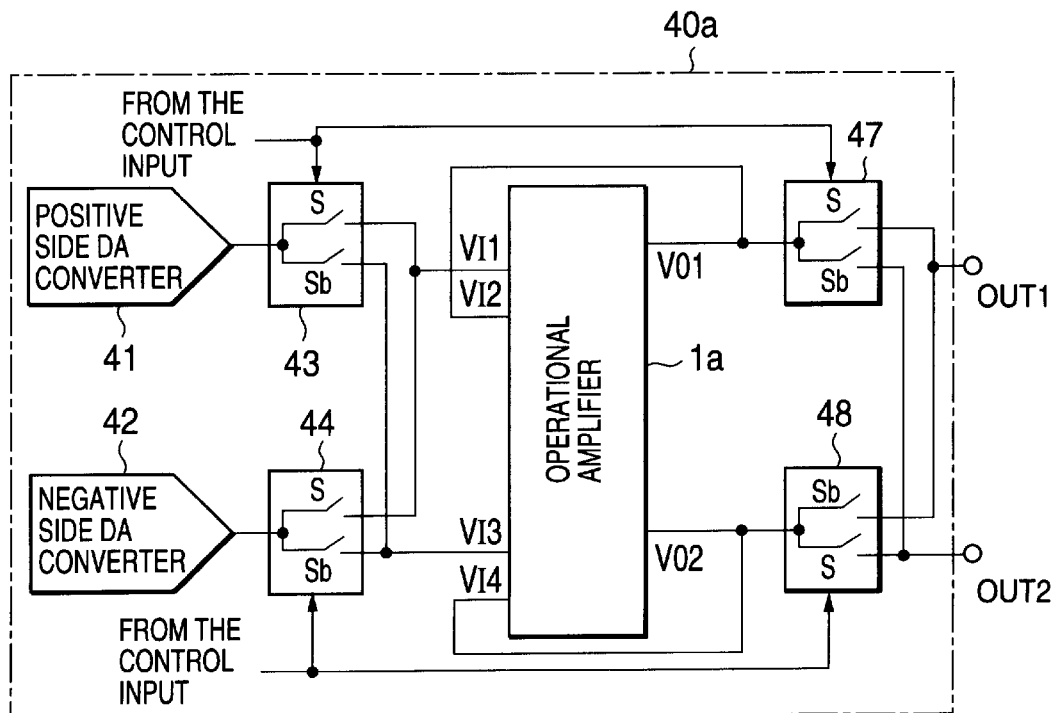
FIG. 8 is a circuit diagram that illustrates an exemplified circuit for driving the liquid crystal panel using the conventional operational amplifier.

FIG. 6 is a circuit diagram that illustrates the configuration of a drive circuit for a liquid crystal panel (LCP-drive circuit) in which the operational amplifier of the present invention is used. As shown in the figure, the drive circuit 40 comprises: a positive side digital-to-analog (DA) converter 41 that translates digital signals to analog signals with respect to the potentials in the range from the middle-potential side power source to the high-potential side power source; a negative side DA converter 42 that translates digital signals to analog signals with respect to the potentials in the range from the low-potential side power source to the middle-potential side power source; switching means 43, 44 for switching the translated outputs from the DA converters 41, 42 using control inputs from the outside; the operational amplifier 1 (see FIG. 1) for obtaining the outputs switched by the switching means 43, 44 through the positive input terminals VO1, VO3 and operationally amplifying the outputs switched by the switching means 43, 44 for the impedance conversion, followed by generating outputs from output terminals VO1, VO2; and switching means 45, 46 for switching the outputs VO1, VO2 from the operational amplifier 1 using control inputs from the outside and then supplying the outputs VO1, VO2 to negative input terminals VO2, VO4 of the operational amplifier; and switching means 47, 48 for switching the outputs VO1, VO2 from the operational amplifier 1 using control inputs from the outside and supplying the outputs to output terminals OUT1, OUT2, respectively. Among these structural components, the DA converters 41, 42, the switching means 43,44, and the switching means 47, 48 are just as in the case with the conventional one shown in FIG. 8, so that the description thereof can be omitted.

In the present embodiment, the drive circuit 40 is characterized in that a novel operational amplifier and the switching means 45, 46 are provided. Particularly, the rive circuit 40 is characterized in that the switching means 45 is comprised of switches S, Sb connected to a negative input terminal VI2 and output input terminals VO1, VO2 and the switches S, Sb can be operated in a complement manner.

The operation of the drive circuit 40 for the liquid crystal panel includes the inputs of an analog signal generated from the positive side DA converter 41 and another analog signal generated from the negative side DA converter 42 into the positive input terminals VI1, VI2, respectively, when the switch S of the switching means 43 to 48 and the switches S1, S2 (see FIG. 1) in the operational amplifier 1 are turned on (while the switches S1b, S2b are turned off). In other words, the analog signal on the positive side is introduced into the differential input stage circuit 2 and the drive stage circuit 4 in the operational amplifier 1 and is then subjected to an impedance transformation, resulting in an output signal generated from the output terminal OUT1. On the other hand, the analog signal on the negative side is introduced into the differential input stage circuit 3 and the drive stage circuit 5 in the operational amplifier 1 shown in FIG. 1 and is then subjected to an impedance transformation, resulting in an output signal generated from the output terminal OUT2.

Subsequently, when the switch Sb of the switching means 43 to 48 and the switches S1b, S2b (see FIG. 1) in the operational amplifier 1 are turned on (while the switches S1, S2 are turned off), the positive input terminal VI1 and the negative input terminal VI2 of the operational amplifier 1 receive an analog signal generated from the positive side DA converter 41 and another analog signal generated from the negative side DA converter 42, respectively. In other words, the analog signal on the positive side is introduced into the differential input stage circuit 2 and the drive stage circuit 5 in the operational amplifier 1 shown in FIG. 1 and is then subjected to an impedance transformation, resulting in an output signal generated from the output terminal OUT2. On the other hand, the analog signal on the negative side is introduced into the differential input stage circuit 3 and ret the drive stage circuit 5 in the operational amplifier 1 shown in FIG. 1 and is then subjected to an impedance transformation, resulting in an output signal generated from the output terminal OUT1.

The LCP-drive circuit 40 is able to generate several tens of outputs of positive- or negative-side analog signals (i.e., to perform several tens of writing operations on the panel). If the scanning line is switched from one to another, then the terminal from which the negative side analog signals are outputted and the terminal from which the positive side analog signals are outputted are replaced with each other to operate with alternating current.

Figure 9:
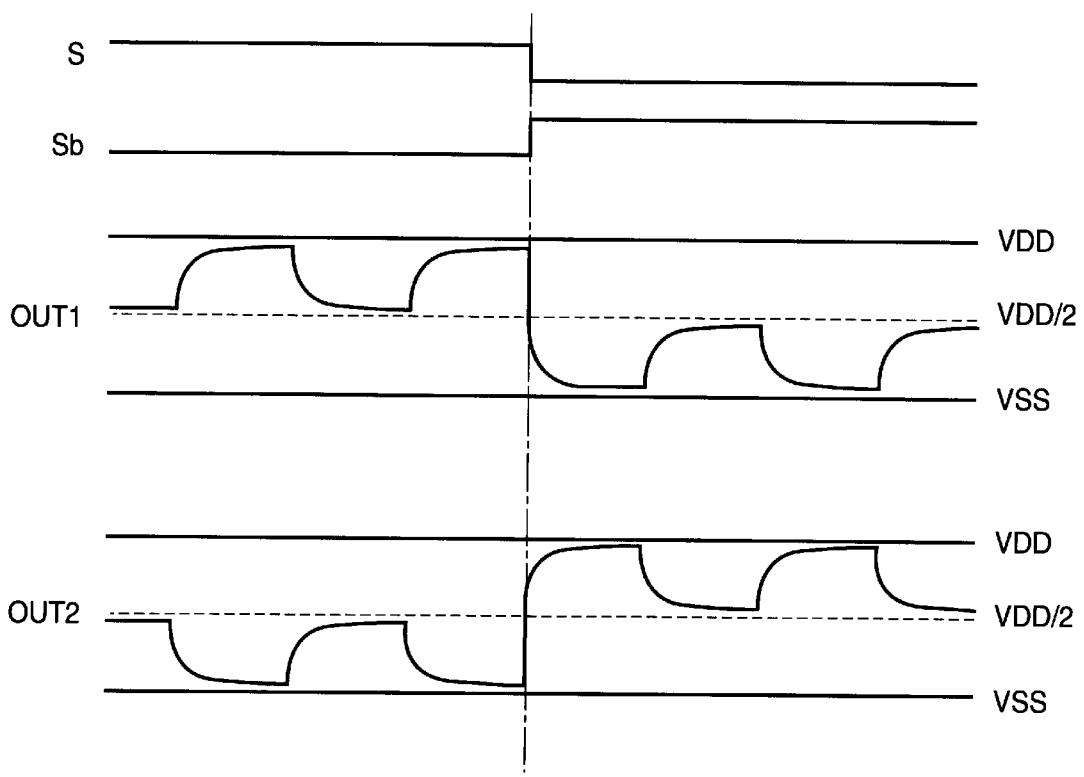
FIG. 9 is timing chart that illustrates output waveforms of the circuit for driving the liquid crystal panel using the conventional operational amplifier.

The LCP-drive circuit 40 to be operated as described above can be represented by a timing chart just as in the case with the conventional drive circuit shown in FIG. 9. In other words, Using the above operational amplifier 1 and the above switching means 43 to 48 allow the charge and discharge operations at the output terminals OUT1, OUT2 can be performed between the high-potential side power source and the middle-potential side power source and between the middle-potential side power source and the low-potential side power source. Therefore, a power consumption P per one output can be expressed by the following equation.

$$P = C \times f \times Vpp \times (VDD/2)$$

Wherein VDD/2 denotes the potential difference between the high-potential side power source and the middle-potential side power source or between the middle-potential side power source and the low-potential side power source, Vpp denotes a writing amplitude, f(Hz) denotes a writing frequency, and C denotes the capacity value of the capacitive load of liquid crystal panel. Furthermore, the writing operation on the positive side and the writing operation on the negative side are performed using the same differential input stage circuit, so that the liquid crystal panel can be prevented from unevenness display to be generated under the operation with alternating current.

In addition, the LCP-drive circuit may be provided as an assembly of a plurality of LCP-drive circuits.

As described above, the operational amplifier for driving the liquid crystal panel in accordance with the present invention switches the pathways for supplying differential stage outputs from the operational amplifier to the drive stage circuit and drives the output stage FET using the middle-potential side power source in addition to use the high- and low-potential side power sources. Therefore, the present invention allows the effects of reducing the amount of load electric power to be generated at the time of charging or discharging the load and preventing the liquid crystal panel from causing an unevenness color image at the time of displaying color image thereon.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. An operational amplifier, comprising:
    a first differential input stage circuit having a differential input terminal including a first positive input terminal and a first negative input terminal and a first output end, which is connected between a low-potential side power source and a high-potential power side to ensure an input range from a level at the low-potential side power source to a level at the high-potential side power source;
    a second differential input stage circuit having a differential input terminal including a second positive input terminal and a second negative input terminal and a second output end, which is connected between a low-potential side power source and a high-potential power side to ensure an input range from a level at the low-potential side power source to a level at the high-potential side power source;
    a first drive stage circuit having a first input end, a third output end, and a fourth output end, which is connected between the low potential side power source and the high potential side power source;
    a second drive stage circuit having a second input end, a fifth output end, and a sixth output end, which is connected between the low potential side power source and the high potential side power source;
    a first semiconductor device in which a first electrode is connected to a third output end of the first drive stage circuit and a second electrode is connected to the high-potential side power source, and a third electrode is connected to a first output terminal;

a second semiconductor device in which a first electrode is connected to a fourth output end of the first drive stage circuit and a second electrode is connected to a middle-potential side power source, and a third electrode is connected to the first output terminal;

a third semiconductor device in which a first electrode is connected to a fifth output end of the second drive stage circuit and a second electrode is connected to the middle-potential side power source, and a third electrode is connected to a second output terminal;

a fourth semiconductor device in which a first electrode is connected to a sixth output end of the second drive stage circuit and a second electrode is connected to the low-potential side power source, and a third electrode is connected to the second output terminal;

a first switching means having switches respectively connecting to the first output end of the first differential input stage circuit and the first input end of the first drive stage circuit and the second input end of the second drive stage circuit, in which the switches are operated in reverse with each other; and a second switching means having switches respectively connecting to the second output end of the second differential input stage circuit and the first input end of the first drive stage circuit and the second input end of the second drive stage circuit, in which the switches are operated in reverse with each other.

2. An operational amplifier as claimed in claim 1, wherein the first drive stage circuit comprises:

a fifth semiconductor device in which a first electrode is connected to the first input end and a second electrode is connected to the low-potential side power source;

a sixth semiconductor device in which first and third electrodes are connected to a third electrode of the fifth semiconductor device and a second electrode is connected to the high-potential side power source;

a seventh semiconductor device in which a first electrode is connected to the first electrode of the sixth semiconductor device and a second electrode is connected to the high-potential side power source;

an eighth semiconductor device in which first and third electrodes are connected to the third output end and a second electrode is connected to a third electrode of the seventh semiconductor device;

a ninth semiconductor device in which a first electrode is connected to the first electrode of the seventh semiconductor device, a second electrode is connected to the high-potential side power source, and a third electrode is connected to the fourth output end;

a first constant current source connected between the third electrode of the eighth semiconductor device and the low-potential side power source; and a second constant current source connected between the fourth output end and the low-potential side power source, and the second drive stage circuit comprises:

a tenth semiconductor device in which a first electrode is connected to the second input end and a second electrode is connected to the low-potential side power source;

an eleventh semiconductor device in which first and third electrodes are connected to a third electrode of the tenth semiconductor device and a second electrode is connected to the high-potential side power source;

a twelfth semiconductor device in which a first electrode is connected to the first electrode of the eleventh semiconductor device and a second electrode is connected to the high-potential side power source;

a thirteenth semiconductor device in which first and third electrodes are connected to a third electrode of the twelfth semiconductor device and the sixth output end;

a fourteenth semiconductor device in which a first electrode is connected to the first electrode of the twelfth semiconductor device, a second electrode is connected to the high-potential side power source, and a third electrode is connected to the fifth output end;

a third constant current source connected between a second electrode of the thirteenth semiconductor device and the low-potential side power source; and a fourth constant current source connected between the third electrode of the fourteenth semiconductor device and the low-potential side power source.

3. An operational amplifier as claimed in claim 1, wherein the first drive stage circuit comprises:

a fifth semiconductor device in which a first electrode is connected to the first input end and a second electrode is connected to the low-potential side power source;

a sixth semiconductor device in which first and third electrodes are connected to a third electrode of the fifth semiconductor device and a second electrode is connected to the low-potential side power source;

a seventh semiconductor device in which a first electrode is connected to the first electrode of the sixth semiconductor device and a second electrode is connected to the low-potential side power source;

an eighth semiconductor device in which first and third electrodes are connected to a third electrode of the seventh semiconductor device and the third output end;

a ninth semiconductor device in which a first electrode is connected to the first electrode of the seventh semiconductor device, a second electrode is connected to the low-potential side power source, and a third electrode is connected to the fourth output end;

a first constant current source connected between the high-potential side power source and third electrode of the eighth semiconductor device;

a second constant current source connected between the high-potential side power source and the second electrode of the eighth semiconductor device; and a third constant current source connected between the high-potential side power source and the fourth output end, and the second drive stage circuit comprises:

a tenth semiconductor device in which a first electrode is connected to the second input end and a second electrode is connected to the low-potential side power source;

an eleventh semiconductor device in which first and third electrodes are connected to a third electrode of the tenth semiconductor device and a second electrode is connected to the low-potential side power source;

a twelfth semiconductor device in which a first electrode is connected to the first electrode of the eleventh semiconductor device and a second electrode is connected to the low-potential side power source;

a thirteenth semiconductor device in which first and third electrodes are connected to the sixth output end and a second electrode is connected to a third electrode of the twelfth semiconductor device;

a fourteenth semiconductor device in which a first electrode is connected to the first electrode of the twelfth semiconductor device, a second electrode is connected to the low-potential side power source, and a third electrode is connected to the fifth output end;

a fourth constant current source connected between the high-potential side power source and the third electrode of the semiconductor device;

a fifth constant current source connected between the high-potential side power source and the third electrode of the thirteenth semiconductor device; and a sixth constant current source connected between the high-potential side power source and the fifth output end.

4. An operational amplifier as claimed in claim 1, wherein the first drive stage circuit comprises:

a fifth semiconductor device in which a first electrode is connected to the first input end and a second electrode is connected to the low-potential side power source;

a sixth semiconductor device in which first and third electrodes are connected to a third electrode of the fifth semiconductor device and a second electrode is connected to the low-potential side power source;

a seventh semiconductor device in which a first electrode is connected to the first electrode of the sixth semiconductor device and a second electrode is connected to the low-potential side power source;

an eighth semiconductor device in which first and third electrodes are connected to a third electrode of the seventh semiconductor device and the third output end;

a ninth semiconductor device in which a first electrode is connected to the first electrode of the seventh semiconductor device, a second electrode is connected to the low-potential side power source, and a third electrode is connected to the fourth output end;

a first constant current source connected between the high-potential side power source and third electrode of the eighth semiconductor device;

a second constant current source connected between the high-potential side power source and the second electrode of the eighth semiconductor device; and a third constant current source connected between the high-potential side power source and the fourth output end, and the second drive stage circuit comprises:

a tenth semiconductor device in which a first electrode is connected to the second input end and a second electrode is connected to the low-potential side power source;

an eleventh semiconductor device in which first and third electrodes are connected to a third electrode of the tenth semiconductor device and a second electrode is connected to the high-potential side power source;

a twelfth semiconductor device in which a first electrode is connected to the first electrode of the eleventh semiconductor device and a second electrode is connected to the high-potential side power source;

a thirteenth semiconductor device in which first and third electrodes are connected to a third electrode of the twelfth semiconductor device and the sixth output end;

a fourteenth semiconductor device in which a first electrode is connected to the first electrode of the twelfth semiconductor device, a second electrode is connected to the high-potential side power source, and a third electrode is connected to the fifth output end;

a fourth constant current source connected between a second electrode of the thirteenth semiconductor device and the low-potential side power source; and a fifth constant current source connected between the fifth output end and the low-potential side power source.

5. An operational amplifier as claimed in claim 1, wherein the first drive stage circuit comprises:

a fifth semiconductor device in which a first electrode is connected to the first input end and a second electrode is connected to the low-potential side power source;

a sixth semiconductor device in which first and third electrodes are connected to a third electrode of the fifth semiconductor device and a second electrode is connected to the high-potential side power source;

a seventh semiconductor device in which a first electrode is connected to the first electrode of the sixth semiconductor device and a second electrode is connected to the high-potential side power source;

an eighth semiconductor device in which first and third electrodes are connected to the third output end and a second electrode is connected to a third electrode of the seventh semiconductor device;

a ninth semiconductor device in which a first electrode is connected to the first electrode of the seventh semiconductor device, a second electrode is connected to the high-potential side power source, and a third electrode is connected to the fourth output end;

a first constant current source connected between the third electrode of the eighth semiconductor device and the low-potential side power source; and a second constant current source connected between the fourth output end and the low-potential side power source, and the second drive stage circuit comprises:

a tenth semiconductor device in which a first electrode is connected to the second input end and a second electrode is connected to the low-potential side power source;

an eleventh semiconductor device in which first and third electrodes are connected to a third electrode of the tenth semiconductor device and a second electrode is connected to the high-potential side power;

a twelfth semiconductor device in which a first electrode is connected to the first electrode of the eleventh semiconductor device and a second electrode is connected to the high-potential side power source;

a thirteenth semiconductor device in which first and third electrodes are connected to the sixth output end and a second electrode is connected to a third electrode of the twelfth semiconductor device;

a fourteenth semiconductor device in which a first electrode is connected to the first electrode of the twelfth semiconductor device, a second electrode is connected to the low-potential side power source, and a third electrode is connected to the fifth output end;

a third constant current source connected between the high-potential side power source and the third electrode of the tenth semiconductor element;

a fourth constant current source connected between the high-potential side power source and the third electrode of the thirteenth semiconductor device; and a fifth constant current source connected to the high-potential side power source and the fifth output end.

6. An operational amplifier as claimed in claim 1, wherein the first differential input stage circuit comprises:

first and second semiconductor devices in which their first electrodes are respectively connected to the first positive input terminal and the first negative input terminal and their second electrodes are connected in common with each other;

a third semiconductor device in which first and third electrodes are connected to a third electrode of the first semiconductor device and a second electrode is connected to the high-potential side power source;

a fourth semiconductor device in which first and third electrodes are connected to the third electrode of the second semiconductor device and a second electrode is connected to the high-potential side power source;

a fifth semiconductor device in which a first electrode is connected to the first electrode of the third semiconductor device and a second electrode is connected to the high-potential side power source;

a sixth semiconductor device in which a first electrode is connected to the first electrode of the fourth semiconductor device, a second electrode is connected to the high-potential side power source, and a third electrode is connected to the first output end;

a seventh constant current source connected between the second electrodes of the first and second semiconductor devices and the low-potential side power source;

seventh and eighth semiconductor devices in which their first electrodes are respectively connected to the first negative input terminal and the first positive input terminal and their second electrodes are connected in common with each other;

a ninth semiconductor device in which first and third electrodes are respectively connected to the third electrodes of the fifth and seventh semiconductor devices and a second electrode is connected to the low-potential side power source;

a tenth semiconductor device in which a first electrode is connected to the first electrode of the ninth semiconductor device, a second electrode is connected to the low-potential side power source, and a third electrode is connected to the first output end and the third electrode of the eighth semiconductor device; and an eighth constant current source connected between the high-potential side power source and the second electrodes of the seventh and eighth semiconductor devices, and the second differential input stage circuit comprises:

eleventh and twelfth semiconductor devices in which their first electrodes are respectively connected to the second positive input terminal and the second negative input terminal and their second electrodes are connected in common with each other;

a thirteenth semiconductor device in which first and third electrodes are connected to a third electrode of the eleventh semiconductor device and a second electrode is connected to the high-potential side power source;

a fourteenth semiconductor device in which first and third electrodes are connected to the third electrode of the twelfth semiconductor device and a second electrode is connected to the high-potential side power source;

a fifteenth semiconductor device in which a first electrode is connected to the first electrode of the thirteenth semiconductor device and a second electrode is connected to the high-potential side power source;

a sixteenth semiconductor device in which a first electrode is connected to the first electrode of the fourteenth semiconductor device, a second electrode is connected to the high-potential side power source, and a third electrode is connected to the second output end;

a ninth constant current source connected between the second electrodes of the eleventh and twelfth semiconductor devices and the low-potential side power source;

seventeenth and eighteenth semiconductor devices in which their first electrodes are respectively connected to the second negative input terminal and the second positive input terminal and their second electrodes are connected in common with each other;

a nineteenth semiconductor device in which first and third electrodes are respectively connected to the third electrodes of the fifteenth and seventeenth semiconductor devices and a second electrode is connected to the low-potential side power source;

a twentieth semiconductor device in which a first electrode is connected to the first electrode of the nineteenth semiconductor device, a second electrode is connected to the low-potential side power source, and a third electrode is connected to the second output end and the third electrode of the eighteen semiconductor device; and a tenth constant current source connected between the high-potential side power source and the second electrodes of the seventeenth and eighteenth semiconductor devices.

* * * * *

UNITED STATES PATENT AND TRADEMARK OFFICE
CERTIFICATE OF CORRECTION

PATENT NO.    : 6,424,219 B1
DATED         : July 23, 2002
INVENTOR(S)   : Fumihiko Kato It is certified that error appears in the above-identified patent and that said Letters Patent is hereby corrected as shown below:

<u>Title page,</u>
Item [22], please correct the Filing Date from "November 5, 2001" to
-- December 5, 2001 --.

Signed and Sealed this

Eleventh Day of November, 2003

JAMES E. ROGAN
*Director of the United States Patent and Trademark Office*